United States Patent [19]
Schneider et al.

[11] Patent Number: 6,108,477
[45] Date of Patent: *Aug. 22, 2000

[54] PHOTONIC COMPONENT WITH ELECTRICAL CONDUCTION PATHS

[75] Inventors: Sigrun Schneider, Tamm; Gerhard Seibold, Remseck; Anton Ambrosy, Tiefenbronn, all of Germany

[73] Assignee: Alcatel, Paris, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/994,855

[22] Filed: Dec. 19, 1997

[30] Foreign Application Priority Data

Dec. 20, 1996 [DE] Germany ............................ 196 53 094

[51] Int. Cl.[7] .................................................. G02B 6/122
[52] U.S. Cl. ................................ 385/129; 385/14; 385/88
[58] Field of Search .................................. 385/129–132, 385/88.14

[56] References Cited

U.S. PATENT DOCUMENTS

| | | | |
|---|---|---|---|
| 3,948,583 | 4/1976 | Tien .................................. | 350/96 WG |
| 4,912,533 | 3/1990 | Takahashi .................................. | 357/17 |
| 5,054,871 | 10/1991 | Deri et al. .................................. | 385/30 |
| 5,182,787 | 1/1993 | Blonder et al. .......................... | 385/131 |
| 5,185,830 | 2/1993 | Nishimoto .................................. | 385/41 |
| 5,282,071 | 1/1994 | Hartman et al. ......................... | 359/129 |
| 5,522,005 | 5/1996 | Moretti et al. ............................ | 385/129 |
| 5,621,837 | 4/1997 | Yamada et al. ........................... | 385/88 |
| 5,721,801 | 2/1998 | Boysel .................................... | 385/130 |

OTHER PUBLICATIONS

Graf, Modern Dictionary of Electronics, Sixth Edition, 1997, Butterworth–Heinemann, p. 742.

"Loss Reduction in Coplanar Waveguide on a Planar Lightwave Circuit (PLC) Platform by Quenching", S. Mino et al, *Journal of Lightwave Technology*, vol. 14, No. 8, Aug. 1996, pp. 1840–1845.

"Compressive Strained Multiquantum–Well Waveguide Photodetectors for Coherent Receivers", A. Ferreras et al, *IEEE Photonics Technology Letters*, vol. 7, No. 5, May 1995, pp. 546–548.

"Monolithically Integrated Semiconductor LED–Amplifier for Applications as Transceivers in Fiber Access Systems", K. Liou et al, *IEEE Photonics Technology Letters*, vol. 8, No. 6, Jun. 1996, pp. 800–802.

"Monolithic Integration of GaAs–(GaaI) As Light Modulators and Distributed–Bragg–Reflector Lasers", M. Shams et al, *Appl. Phys. Lett.* (32(5), Mar. 1, 1978, pp. 314–316.

"A Superluminescent Diode at l.3 m with Very Low Spectral Modulation", B. Patterson et al, *IEEE Journal of Quantum Electronics*, vol. 30, No. 3, Mar. 1994, —. 703–712.

"Integration of a Diode Laser and an Electronic Lens for Controlling the Beam Focus Position", S. Mukai et al, *Appl Phys Lett.*, 54(4), Jan. 23, 1989, pp. 315–316.

Patent Abstracts of Japan E–803, Aug. 9, 1989, vol. 13, No. 356, and Japanese Patent Application 62–271638. (Toshiba Corp.).

Patent Abstracts of Japan E–655, Sep. 7, 1998, vol. 12, No. 330, and Japanese Patent Application 61–241680 (Mitsubishi).

*Primary Examiner*—John D. Lee
*Attorney, Agent, or Firm*—Ware, Fressola, Van Der Sluys & Adolphson LLP

[57] ABSTRACT

The invention relates to a substrate (SUB) serving as a support, an optical waveguide (OWL) disposed on the substrate (SUB) and electrical conduction paths (ELB). Conventionally, the electrical conduction paths are placed on a thin insulating layer covering the substrate. According to the invention, the electrical conduction path (ELB) are routed on top of the surface (WOF) of the optical waveguide (OWL). This provides an improved insulation of the electrical conduction paths (ELB); moreover, the substrate surface is better utilized. Preferably, the electrical conduction paths (ELB) which are placed in ramp-like recesses (RA), are routed from the substrate surface (SOF) upwards to the surface (WOF) of the optical waveguide (OWL). The invention can be employed most advantageously proximate to laser bars where several conduction paths which are combined to form coplanar electrical waveguides, are arranged in a tight space.

15 Claims, 2 Drawing Sheets

PHOTONIC COMPONENT WITH ELECTRICAL CONDUCTION PATHS

BACKGROUND OF THE INVENTION

1. Technical Field

The invention relates to a photonic component having a substrate support with an optical waveguide thereon and an electrical conduction path.

2. Discussion of Related Art

A photonic component of this type is known from a publication by S. Mino et al. entitled "Loss reduction in a Coplanar waveguide on a Planar Light Waveguide Circuit (PLC) Platform by Quenching". A silicon substrate carries an optical waveguide, a laser diode, control electronics for the laser diode and electrical conduction paths forming coplanar electrical waveguides. Since the electrical conductivity of the silicon substrate increases with increasing frequency, the electrical conduction paths are not applied directly to the surface of the silicon substrate. Instead, the electrical conduction paths are separated from the silicon substrate by a thin insulating layer, which for the photonic component described in the publication consists of silica glass. Also used in the art are insulating layers made from polyimides or from other organic materials.

The insulating layers to be applied are usually very thin. It is in general not possible to apply thicker insulating layers, since optoelectronic components secured to the insulating layer would then be located too high above the inputs of the optical waveguides. Moreover, when the insulating layers become thicker, electrical conduction paths disposed thereon would have to be connected to lower lying components with bond wires. The tools for establishing an electrical connection through bond wires require substantial space. Such space is generally not available when photonic components are highly integrated, particularly proximate of laser bars.

When the insulating layers are very thin, the resulting electrical insulation is insufficient. As also mentioned in the aforementioned publication, the electrical losses at high frequencies are substantial even if the electrical conduction paths are placed on top of an insulating layer.

OBJECT OF THE INVENTION

It is therefore an object of the invention to provide a photonic component with electrical conduction paths having small electrical losses. The photonic component should enable the placement of many optical, electrooptical and electrical components in a tight space. The separation between electrical conduction paths should also be large even with a high integration density, so that mutual interference of the electrical properties is effectively prevented.

According to the present invention, a photonic component with a substrate serving as a support, an optical waveguide disposed on the substrate and an electrical conduction path is characterized in that the electrical conduction path is disposed on a surface of the optical waveguide facing away from the substrate.

With the photonic component of the invention, the electrical conduction paths are not routed on top of a separately applied insulating layer, but rather on the surface of an already existing optical waveguide. The optical waveguide is a superb electrical insulator due to its thickness. It is another advantage of this arrangement that the otherwise unused area on the already existing waveguides is effectively used as a support for electrical conduction paths. In this way, larger separations between the electrical conduction paths can be obtained. Most advantageously, however, with the solution of the invention, no space or only very little space is required for providing electrical conduction paths on the substrate surface, so that optical and electrooptical components to be placed on the surface with a much higher density.

In a particularly advantageous embodiment, the lateral peripheral surfaces are provided with recesses in such a way that in the region of the recesses the lateral peripheral surfaces are inclined with respect to the substrate surface. Electrical conduction paths on the substrate plane are routed over these inclined peripheral surfaces and connected with electrical conduction paths disposed on the surface of the optical waveguide such as to be almost free of kinks. These recesses can also be implemented such that the connection between the substrate surface and the waveguide surface is continuous, i.e., completely kink-free. The invention can be used in a particularly advantageous manner, if the electrical conduction paths are constructed as coplanar electrical waveguides. Additional advantageous embodiments are described in the dependent claims.

BRIEF DESCRIPTION OF THE DRAWING

The invention is described hereinafter by way of example with reference to embodiments and to the drawing. In the drawing is shown in.

DETAILED DESCRIPTION OF PREFERRED EMBODIMENTS

Figure 1:
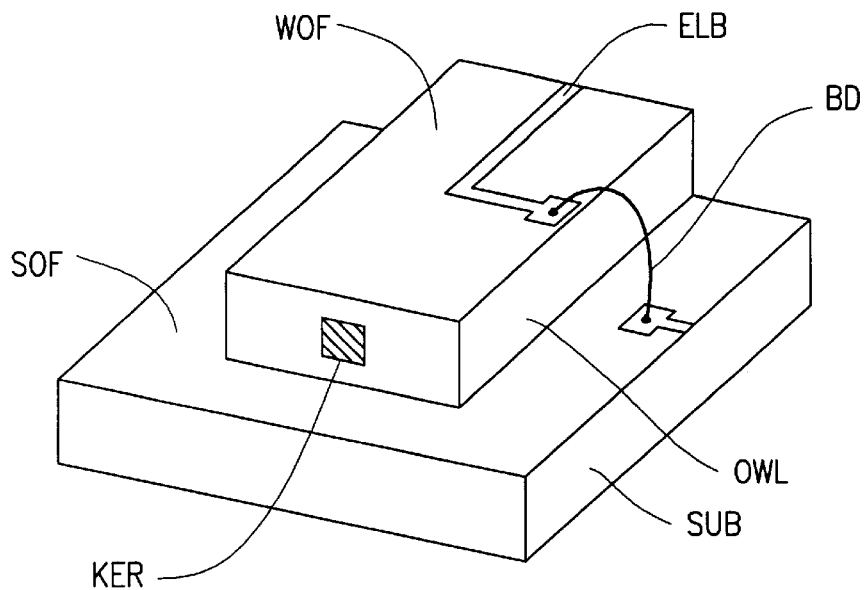
FIG. 1 is a perspective view of a partial section of a photonic component in accordance with the invention.

The photonic component of the invention depicted in FIG. 1 includes a substrate SUB serving as a support and a planar optical waveguide OWL disposed on a portion of the substrate surface SOF. A surface WOF of the optical waveguide OWL facing away from a support surface of the substrate is provided with an electrical conduction path ELB.

In this embodiment, the substrate SUB is a silicon single crystal. The optical waveguide OWL is comprised of silica glass which is deposited on the substrate surface by flame hydrolysis (FHD, "Flame Hydrolysis Deposition"). The electrical conduction path ELB is deposited on the surface WOF of the optical waveguide OWL by the same or similar process which is used for depositing the electrical conduction paths on the silica glass insulating layers.

A ceramic material can also be employed as substrate. Other materials and manufacturing processes are known for making the optical waveguide and are suitable for carrying out the invention. Possible and advantageous is in particular the use of polymers, such as polymethylmethacrylate (PMMA). Suitable materials for the electrical conduction path are especially gold and silver.

In the partial section of the photonic component of the invention depicted in FIG. 1, the lateral peripheral surfaces of the optical waveguide OWL are approximately normal to the substrate surface SOF. Such vertical peripheral surfaces can be generated, for example, by one-level or multi-level deep-etching processes. On the substrate surface SOF there are disposed—not shown in FIG. 1—optoelectronic or purely electronic components, such as semiconductor lasers, photo diodes and/or control processors. Conduction paths on the substrate surface SOF provide the electrical connection to these components. These electrical conduction paths on the substrate surface SOF are connected through bond wires 8D to the electrical conduction paths disposed on the surface WOF of the optical waveguide. An example for a single electrical conduction path of this type is depicted in FIG. 1.

In a particularly advantageous embodiment of the invention, the conduction paths on the substrate surface and conduction paths on the optical waveguide are not connected through bond wires, but rather through electrical conduction paths. These electrical conduction paths are routed through recesses in the lateral peripheral surfaces of the optical waveguide. These recesses are designed in such a way that in the region of the recesses the lateral peripheral surfaces are inclined with respect to the substrate surface. The ensuing ramps ensure that the electrical conduction path is routed entirely without kinks or at least substantially without kinks from the substrate plane to the surface of the optical waveguide.

Figure 2:
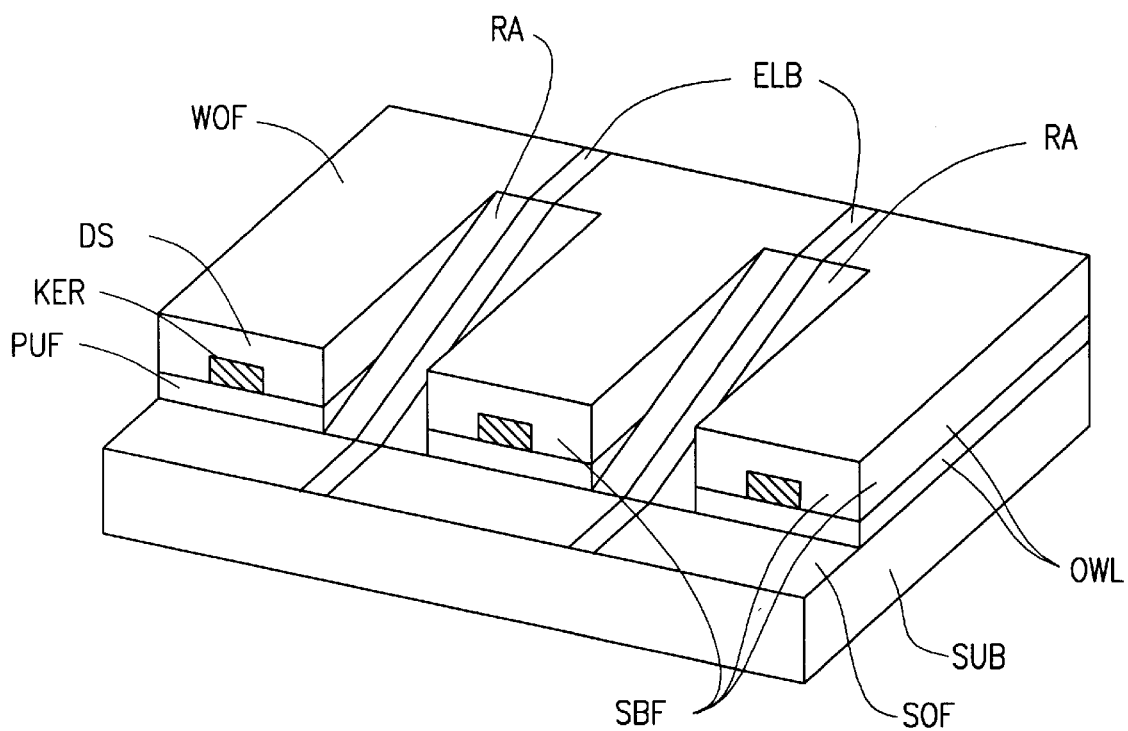
FIG. 2 is another perspective view of a partial section of a photonic component in accordance with the invention.

In FIG. 2, there is depicted an arrangement of this type with recesses in the lateral peripheral surfaces of the optical waveguide. The optical waveguide OWL which includes a buffer layer PUF, a waveguide core KER as well as a cover layer DS, is arranged on a substrate SUB. The front lateral peripheral surface SBF of the optical waveguide OWL facing the observer is provided with two recesses. Electrical conduction paths ELB are routed on the ramps RA which are formed by the recesses. These electrical conduction paths ELB connect electrical conduction paths on the substrate surface SOF with the electrical conduction paths disposed on the surface WOF of the optical waveguide OWL. As seen from FIG. 2, kinks only occur at the transition points where the inclined lateral peripheral surfaces which form the ramps RA, join the surfaces of the substrate and the optical waveguide, respectively.

Figure 3:
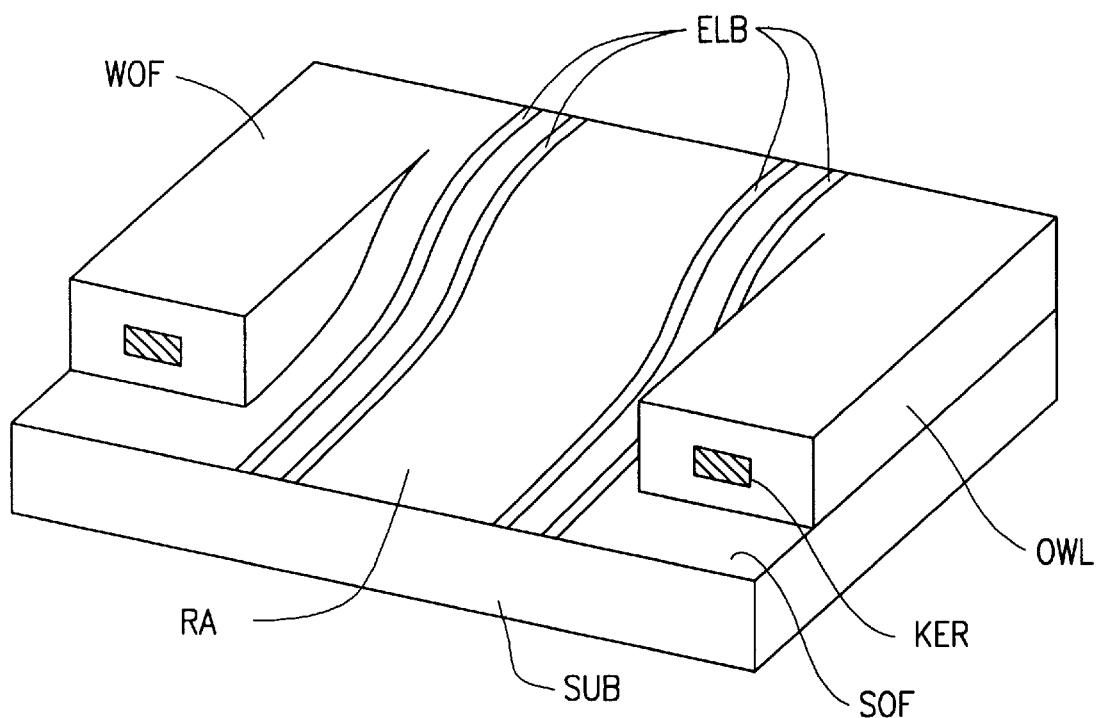
FIG. 3 is yet another perspective view of a partial section of a photonic component in accordance with the invention.

In order to eliminate kinks entirely, these transition points can be designed to be continuous. This is depicted in FIG. 3. The lateral peripheral surfaces in the region of the recesses are here not planar, but curved. In this way, the electrical conduction paths ELB can be routed across the difference in elevation between the substrate surface SOF and the surface WOF of the optical waveguide OWL, so that the mechanical and electrical properties of the electrical conduction paths ELB are not adversely affected by kinks in the electrical conduction paths.

The manner in which the inclined lateral peripheral surfaces of the optical waveguide are fabricated, is determined by the material used in the manufacture of the optical waveguide. Optical waveguides made from $SiO_2$ can be processed by wet chemical etching. The peripheral surfaces are then inclined relative to the substrate surface by an angle of about 45°. Alternatively, the ramps can be defined by halftone lithography and subsequently dry etched from the optical waveguide. This process can be advantageously used especially with polymer waveguides. Halftone lithography is suitable in particular for manufacturing continuous transitions between the inclined peripheral surfaces and the surfaces of the substrate and the optical waveguide, respectively.

In FIG. 3, the electrical conduction paths are arranged in pairs. These pairs form coplanar waveguides which permit transmission rates in the range of several Gbit/s. The invention is particularly suited for operation with coplanar electrical waveguides of this type, since with electrical waveguides which are disposed directly on a substrate or on a thin insulating layer on such substrate, suffer from large electrical losses and/or signal distortions at high frequencies.

As already mentioned above, the invention has the significant advantage that on the substrate surface, electrical conduction paths are required only in the immediate vicinity of the optoelectronic or electronic components. Connections to more distal points on the substrate, such as connections to the housing, are made preferably on the surface of the optical waveguide. This advantageously allows a higher integration density of the components on the substrate surface.

This aspect is of particular importance if the light emitted from a laser bar is to be coupled to an arrangement of optical waveguides. The separation between the laser diodes of the laser bar is in general so small, that underneath and proximate to the laser bar a large number of electrical conduction paths has to be placed very close to each other. According to the invention, all or a portion of these electrical conduction paths can be routed to the substrate surface over ramps. The separation between the electrical conduction paths can thereby be increased and the electrical transmission properties improved.

What is claimed is:

1. Photonic component comprising:
    a substrate (SUB) having a substrate surface (SOF) and serving as a support;
    a first electrical conduction path (ELB) disposed on the substrate surface (SOF);
    an optical waveguide (OWL) disposed on only a portion of the substrate surface (SOF) and etched to form a terrace raised above the substrate surface (SOF) with a waveguide surface (WOF) facing away from the substrate surface (SOF); and
    a second electrical conduction path (ELB) having an entire length thereof disposed on the waveguide surface (WOF) to establish a physical adhesive bonding between the second electrical conduction path (ELB) and the waveguide surface (WOF), the second electrical conduction path (ELB) being insulated from the substrate (SUB) by the optical waveguide (OWL), and the second electrical conduction path (ELB) being electrically coupled to the first electrical conduction path on the substrate surface (SOF).

2. Photonic component according to claim 1, wherein the optical waveguide (OWL) comprises a buffer layer (PUF), a core layer (KER) and a cover layer (DS).

3. Photonic component according to claim 1, characterized in that the substrate (SUB) is made from silicon.

4. Photonic component according to claim 1, characterized in that the optical waveguide (OWL) is made from glass or from a polymer.

5. Photonic component according to claim 1,
    wherein at least one sloped portion (RA) of a lateral peripheral surface (SBF) of the optical waveguide (OWL) is inclined with respect to the substrate surface (SOF) of the substrate (SUB); and
    wherein the first electrical conduction path is routed across said at least one sloped portion (RA) to the second electrical conduction path (ELB).

6. Photonic component according to claim 5, wherein the at least one portion (RA) of the lateral peripheral surface (SBF) of the optical waveguide (OWL) which is inclined with respect to the substrate surface (SOF), makes a kink-free transition to the substrate surface (SOF) and to the surface of the optical waveguide (OWL).

7. Photonic component according to claim 5, wherein the at least one sloped portion (RA) of the lateral peripheral surface (SBF) of the optical waveguide (OWL) which is inclined with respect to the substrate surface (SOF), is created by wet chemical etching or by half tone lithography.

8. Photonic component according to claim 1, comprising a plurality of optical waveguides (OWL) and/or electrical conduction paths (ELB).

9. Photonic component according to claim 8, wherein two adjacent electrical conduction paths (ELB) are each arranged side by side in such a way that said two electrical conduction paths form a coplanar electrical high frequency waveguide.

10. Photonic component comprising:
   a substrate (SUB) having a substrate surface (SOF) and serving as a support;
   two optical waveguides (OWL), each disposed on the substrate surface (SOF), each having a respective waveguide surface (WOF), and each having a respective lateral peripheral surface (SBF) and a respective core (KER);
   a sloped portion (RA) inclined with respect to the substrate surface (SOF) of the waveguide surface (WOF); and
   an electrical conduction path (ELB) disposed on the waveguide surface (WOF) facing away from the substrate surface (SOF) and being routed across the sloped portion (RA).

11. Photonic component according to claim 10, wherein the at least one sloped portion (RA) forms a kink-free transition between the substrate surface (SOF) and to the waveguide surface (WOF).

12. Photonic component according to claim 10, wherein the at least one sloped portion (RA) is created either by wet chemical etching or by half tone lithography.

13. Photonic component comprising:
   a substrate (SUB) having a substrate surface (SOF) with a first electrical conduction path disposed on a portion of the substrate surface (SOF) and to be connected to optoelectronic or purely electronic components, including a semiconductor laser, a photodiode or a control processor, disposed on the substrate surface (SOF);
   an optical waveguide (OWL) having a waveguide core (KER) and being disposed on a remaining portion of the substrate surface (SOF) and etched to form a terrace on the substrate surface (SOF), the optical waveguide (OWL) having a waveguide surface (WOF) with an entire length of a second electric conduction path (ELB) disposed thereon and facing away from the substrate surface (SOF) to establish a physical adhesive bonding between the second electrical conduction path (ELB) and the optical waveguide (OWL); and
   a connector for electrically coupling the first electrical conduction path (ELB) on the waveguide surface (WOF) to the second electrical conduction path on the substrate surface (SOF).

14. Photonic component according to claim 13, wherein the connector is a bond wire.

15. Photonic component according to claim 13,
   wherein the optical waveguide (OWL) has recesses formed therein with a sloped ramp (RA); and
   wherein the connector is an electrical conduction path that couples the first electric conduction path (ELB) to the second electrical conduction path.

* * * * *